United States Patent
Jia et al.

(10) Patent No.: US 12,364,081 B2
(45) Date of Patent: Jul. 15, 2025

(54) LIGHT EMITTING DEVICE AND METHOD FOR PRODUCING THE SAME

(71) Applicant: TIANJIN SANAN OPTOELECTRONICS CO., LTD., Tianjin (CN)

(72) Inventors: Yuehua Jia, Tianjin (CN); Weifan Ke, Tianjin (CN); Huanshao Kuo, Tianjin (CN); Yu-Ren Peng, Tianjin (CN); Duxiang Wang, Tianjin (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 553 days.

(21) Appl. No.: 17/939,394

(22) Filed: Sep. 7, 2022

(65) Prior Publication Data

US 2023/0080272 A1 Mar. 16, 2023

(30) Foreign Application Priority Data

Sep. 10, 2021 (CN) .......................... 202111059485.8

(51) Int. Cl.
*H01L 33/62* (2010.01)
*H10H 20/852* (2025.01)
*H10H 20/857* (2025.01)

(52) U.S. Cl.
CPC ........ *H10H 20/857* (2025.01); *H10H 20/852* (2025.01)

(58) Field of Classification Search
None
See application file for complete search history.

(56) References Cited

U.S. PATENT DOCUMENTS

| 2021/0066549 A1* | 3/2021 | Liu | H10H 20/8312 |
| 2021/0135059 A1* | 5/2021 | Lee | H10H 20/8312 |

\* cited by examiner

*Primary Examiner* — William C Trapanese
(74) *Attorney, Agent, or Firm* — MUNCY, GEISSLER, OLDS & LOWE, P.C.

(57) ABSTRACT

A light-emitting device includes a first type semiconductor layer, an active layer, a second type semiconductor layer disposed adjacent to the active layer and opposite the first type semiconductor layer, and including a current spreading layer that has a recess, an insulation layer filling the recess and protruding from a surface of the current spreading layer that faces in a direction away from the active layer, and a contact layer disposed on the surface of the current spreading layer which lacks said insulation layer. A sum of a depth of the recess and a thickness of the contact layer is not less than a thickness of the insulation layer. A method for producing the light-emitting device is also disclosed.

20 Claims, 8 Drawing Sheets

(A)

(B)

LIGHT EMITTING DEVICE AND METHOD FOR PRODUCING THE SAME

CROSS-REFERENCE TO RELATED APPLICATION

This application claims priority of Chinese Patent Application No. 202111059485.8, filed on Sep. 10, 2021.

FIELD

The present disclosure relates to a semiconductor device, and more particularly to a light-emitting device and method for producing the same.

BACKGROUND

Light-emitting diodes (LEDs) include a p-n junction that is an interface between n-type and p-type semiconductor regions, so as to convert electrical energy into light energy. A vertical-type light-emitting diode (VLED) usually has an insulation layer and a contact layer disposed on a semiconductor layer. The insulation layer serves as a current blocking (CB) layer, and is made of insulating materials such as silicon oxide, silicon nitride, etc. The CB layer is formed with CB holes penetrating therethrough. The CB holes are filled with a metal material to form the contact layer. By way of this design, the current spreads out as much as possible on a surface of the LED where light is emitted by an active layer. The active layer is prevented from emitting the light in areas above and below electrodes where light emission tends to be blocked by the electrodes, thereby improving light-emitting efficiency of the LED.

FIGS. 1 and 2 illustrate two types of conventional LEDs.

Referring to FIG. 1, one type of conventional LED includes a first type semiconductor layer 181, an active layer 171, and a second type semiconductor layer 161 laminated in such order. An insulation layer 152 is partially formed on a top surface of the second type semiconductor layer 161 to expose a plurality of spaced regions of the second type semiconductor layer 161 so as to form CB holes penetrating through the insulation layer 152. A contact layer 151 that is used as current passages is formed by filling a conductive material in the CB holes. The insulation layer 152 is flush with the contact layer 151 to cooperatively define a continuous planar surface. Then, a reflection layer 141 is formed on the continuous planar surface and bonded to a substrate 121 through a bonding layer 131. Finally, an electrode 182 is formed on the first type semiconductor layer opposite to the active layer 171.

Since the reflection layer 141 is formed on the continuous planar surface, the presence of interstices between the reflection layer 141 and the bonding layer 131 may be avoided. However, in such structure, a considerable amount of precious metal (e.g. gold-zinc alloy) is required for forming the contact layer 151 and thus, will most likely contribute to a higher production cost.

Referring to FIG. 2, the other type of the conventional LEDs has a structure similar to that of the one type shown in FIG. 1 but omits formation of the contact layer 151. The reflection layer 141 is directly formed to cover the insulation layer 152 and to fill the CB holes, and extends in a direction opposite to the second type semiconductor layer 161. However, omission of the contact layer 151 is likely to cause an interface between the reflection layer 141 and the bonding layer 131 to be uneven, and occurrence of the interstices between the reflection layer 141 and the bonding layer 131 is unavoidable.

SUMMARY

Therefore, an object of the disclosure is to provide a light-emitting device and a production method thereof that can alleviate or overcome the aforesaid shortcomings of the prior art.

According to an aspect of the disclosure, a light-emitting device includes a first type semiconductor layer, an active layer, a second type semiconductor layer, an insulation layer, and a contact layer. The second type semiconductor layer is disposed adjacent to the active layer and opposite the first type semiconductor layer, and includes a current spreading layer that has a recess. The insulation layer fills the recess and protrudes from a surface of the current spreading layer that faces in a direction away from the active layer. The contact layer is disposed on the surface of the current spreading layer which lacks the insulation layer. A sum of a depth of the recess and a thickness of the contact layer is not less than a thickness of the insulation layer.

According to a second aspect of the disclosure, a method for producing a light-emitting device includes the steps of: providing a light-emitting laminated structure that has a first type semiconductor layer, an active layer, a second type semiconductor layer that are disposed on one another in such order, the second type semiconductor layer including a current spreading layer; patterning the current spreading layer to form a recess; forming an insulation layer that fills the recess of the current spreading layer; and forming a contact layer on a surface of the current spreading layer that lacks the insulation layer. A sum of a depth of the recess and a thickness of the contact layer is not less than a thickness of the insulation layer.

BRIEF DESCRIPTION OF THE DRAWINGS

Other features and advantages of the disclosure will become apparent in the following detailed description of the embodiments with reference to the accompanying drawings. It is noted that various features may not be drawn to scale.

DETAILED DESCRIPTION

Figure 1:
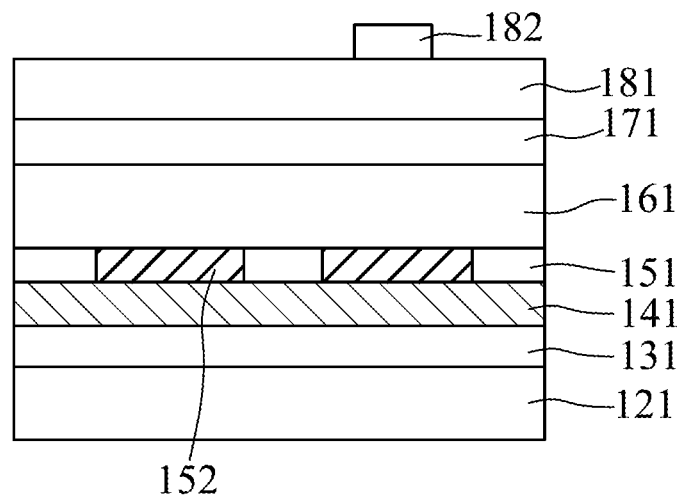
FIG. 1 is a schematic sectional view illustrating a conventional light-emitting diode.
Figure 2:
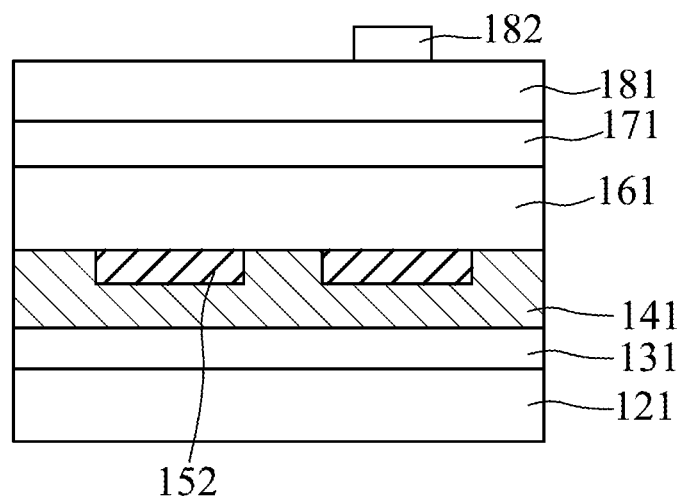
FIG. 2 is a schematic sectional view illustrating an another conventional light-emitting diode.

Before the disclosure is described in greater detail, it should be noted that where considered appropriate, reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 3:
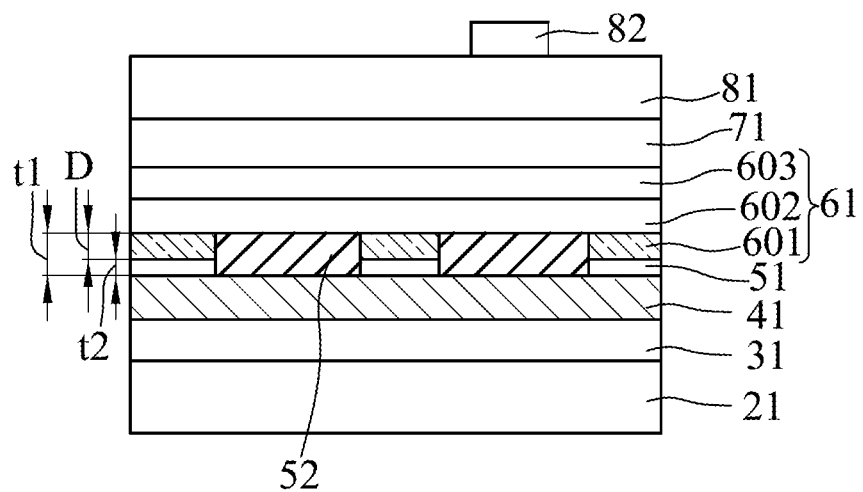
FIG. 3 is a schematic sectional view illustrating an embodiment of a light-emitting device according to the present disclosure.
Figure 4:
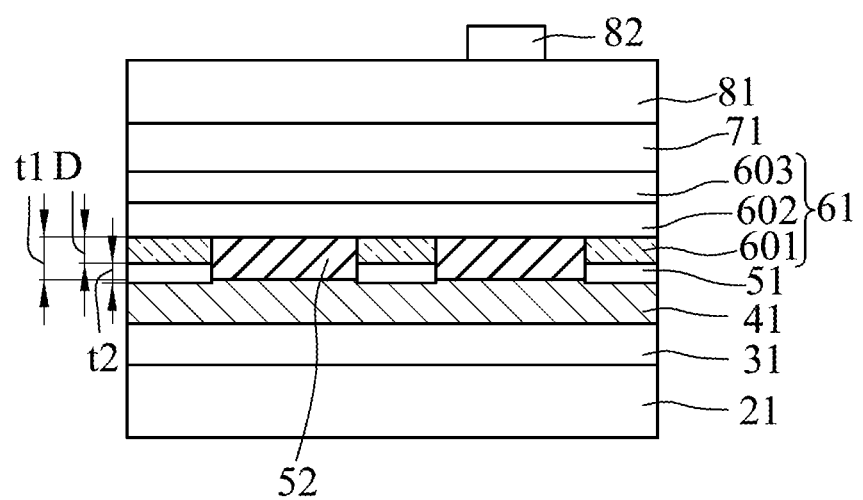
FIGS. 4 to 7 are schematic sectional views respectively illustrating variations of the light-emitting device shown in FIG. 3.

Referring to FIGS. 3 and 4, an embodiment of a light-emitting device according to the present disclosure includes a first type semiconductor layer 81, an active layer 71, and a second type semiconductor layer 61 disposed adjacent to the active layer 71 and opposite the first type semiconductor layer 81. The second type semiconductor layer 61 includes a current spreading layer 601 that has at least one recess.

The light emitting device further includes an insulation layer 52, a contact layer 51, and a reflection layer 41. The insulation layer 52 fills the at least one recess of the current spreading layer 601 and protrudes from a surface of the current spreading layer 601 that faces in a direction away from the active layer 71 and that is opposite the first type semiconductor layer 81. The contact layer 51 is disposed on the surface of the current spreading layer 601 which lacks the insulation layer 52. The reflection layer 41 is formed on the contact layer 51 and the insulation layer 52 opposite the current spreading layer 601. A sum of a depth (D) of the at least one recess and a thickness (t2) of the contact layer 51 is not less than a thickness (t1) of the insulation layer 52.

In certain embodiments, the light-emitting device further includes a substrate 21 bonded to the reflection layer 41 through a bonding layer 31.

The first type semiconductor layer 81, the active layer 71, and the second type semiconductor layer 61 may be made of group III-V compound semiconductors, including but not limited to a gallium nitride (GaN)-based material, a gallium phosphide (GaP)-based material, and an aluminum gallium indium phosphide (AlGaInP)-based material. The first type semiconductor layer 81 has a conductivity type opposite to that of the second type semiconductor layer 61. For instance, the first type semiconductor layer 81 may be doped with an n-type dopant providing electrons, and the second type semiconductor layer 61 may be doped with a p-type dopant providing holes, and vice versa. In this embodiment, the first type semiconductor layer 81 is an n-type semiconductor layer, and the second type semiconductor layer 61 is a p-type semiconductor layer. The first type semiconductor layer 81 may be doped with an n-type dopant such as silicon (Si), germanium (Ge), tin (Sn), etc., and the second type semiconductor layer 61 may be doped with a p-type dopant such as magnesium (Mg), zinc (Zn), calcium (Ca), strontium (Sr), barium (Ba), etc.

Each of the first type semiconductor layer 81 and the second type semiconductor layer 61 may include a plurality of functional layers. In this embodiment, referring to FIG. 3, the second type semiconductor layer 61 includes a blocking layer 603 that is close to the active layer 71, a transition layer 602 that is interposed between the blocking layer 603 and the current spreading layer 601, and the at least one current spreading layer 601 that is disposed on the transition layer 602 opposite to the blocking layer 603.

The current spreading layer 601 provides current spreading and serves as an ohmic contact, and may be made from a p-type GaP based material. In this embodiment, the at least one recess of the current spreading layer 601 is recessed from a surface distal from the transition layer 602 toward the transition layer 602, e.g., the at least one recess may be formed by patterning the current spreading layer 601. Furthermore, the current spreading layer 601 has a thickness ranging from 0.15 μm to 2 μm, e.g., 0.15 μm, 0.2 μm, 0.4 μm, 0.6 μm, 0.8 μm, 1.0 μm, 1.2 μm, 1.4 μm, 1.6 μm, 1.8 or 2.0 μm. In certain embodiments, the thickness of the current spreading layer 601 ranges from 0.2 μm (2000 Å) to 0.7 μm (7000 Å).

The transition layer 602 may be made of a graded-composition material for transition between the current spreading layer 601 and the blocking layer 603, so as to enhance crystal quality of the light-emitting device. The blocking layer 603 is used to block electrons from entering or leaking to the second type semiconductor layer 61, so that light-emitting efficiency of the light-emitting device is enhanced. In some embodiments, the first type semiconductor layer 81 includes a plurality of functional layers such as a main layer, a super lattice layer, an ohmic contact layer, etc. The functional layers can be selected by those skilled in the art according to the practical considerations, and descriptions thereof are omitted herein for brevity.

In this embodiment, the active layer 112 is formed as a light-emitting layer that has a single quantum well structure or a multiple quantum well structure, and is configured to emit light with a radiative recombination mechanism, i.e., recombination of electrons (provided by the first type semiconductor layer 81) and holes (provided by the second type semiconductor layer 61), and the light may have a predetermined wavelength within a visible region (e.g., blue light, green light, and red light, etc.) or an invisible region (e.g., infrared light, etc.) of the electromagnetic spectrum.

Referring to FIGS. 3 and 4, the insulation layer 52 penetrates an entire thickness (the entire length in the depth direction) of the current spreading layer 601. In this embodiment, referring to FIG. 3, the sum of the depth (D) of the at least one recess and a thickness (t2) of the contact layer 51 is equal to the thickness (t1) of the insulation layer 52, i.e., D+t2=t1. In such case, the insulation layer 52 is flush with the contact layer 51 to form a continuous planar surface to interface with the reflection layer 41.

Referring to FIG. 4, in some variations of this embodiment, under the condition of limited voltage, it may be difficult for the insulation layer 52 and the contact layer 51 to form a continuous planar surface to interface with the reflection layer 41, and the sum of the depth (D) of the at least one recess and the thickness (t2) of the contact layer 51 may be greater than the thickness (t1) of the insulation layer 52, i.e., D+t2>t1. Compared with the condition of the insulation layer 52 being flush with the contact layer 51, resistance between the reflection layer 41 and the contact layer 51 may be increased, and an operating voltage of the light-emitting device would be inevitably increased. Therefore, in order to maintain the operation of the light-emitting device within acceptable resistance and operating voltage values while concurrently having as little as possible adverse affect on the flatness of the reflection layer 41 and the bonding layer 31, a difference between the sum of the depth (D) of the at least one recess and the thickness (t2) of the contact layer 51 and the thickness (t1) of the insulation layer 52 may range from greater than 0 to 350 Å. Alternatively, the insulation layer 52 and the contact layer 51 may be subjected to a planarization treatment using chemical mechanical polishing (CMP) to be more flush with each other.

In this embodiment, the thickness (t1) of the insulation layer 52 ranges from 1000 Å to 7000 Å, e.g., 1000 Å, 2000 Å, 2500 Å, 3000 Å, 4000 Å, 5000 Å, 6000 Å, or 7000 Å. In certain embodiments, the thickness (t1) of the insulation layer 52 ranges from 3000 Å to 4000 Å. The thickness (t2) of the contact layer 51 ranges from 500 Å to 3000 Å, e.g., 500 Å, 1000 Å, 1500 Å, 2000 Å, 2500 Å, or 3000 Å. In this embodiment, a cross section of the contact layer 51 along a plane perpendicular to a depth direction of the at least one recess has a circular outline. The circular outline may have a diameter ranging from 4 µm to 12 µm, in certain embodiments, the diameter of the circular outline ranges from 4 µm to 10 µm, or from 4 µm to 8 µm, e.g., 4 µm, 5 µm, 6 µm, 7 µm, or 8 µm. In this embodiment, the diameter of the circular outline is 6 µm. Moreover, of an area of the second type semiconductor layer 61, a percentage of an area of the contact layer 51 ranges from 1.5 to 10%, so that the operating voltage of the light-emitting device is controllable and is within a reasonable range.

Through inclusion of the insulation layer 52 that serves as the current blocking layer and the contact layer 51 that serves as current passages (CB holes), the current first passes through the contact layer 51 and then flows through the entire surface of the second type semiconductor 61, thereby avoiding current crowding and ensuring the current spreads out as much as possible on a surface of the second type semiconductor layer 61. Hence, the light-emitting efficiency of the light-emitting device is enhanced.

The insulation layer 52 may be made of silicon dioxide (SiO$_2$), silicon nitride (Si$_3$N$_4$), silicon oxynitride (SiON), or any combinations thereof. In certain embodiments, the insulation layer 52 may include a SiO$_x$/SiN$_x$ laminated structure or an Al$_2$O$_3$/TiO$_2$ laminated structure. In other embodiments, the contact layer 51 is used to form an ohmic contact, and may be made from a metal material, e.g., gold, zinc, beryllium, titanium, platinum, and combinations thereof, or a transparent conductive material, e.g., indium tin oxide (ITO), indium zinc oxide (IZO), and aluminum-doped zinc oxide (AZO), etc. In certain embodiments, the contact layer 51 may include a gold/gold-zinc alloy/gold laminated structure.

The reflection layer 51 may be made of gold, silver, aluminum, rhodium, platinum, titanium, palladium, or any combinations thereof. In certain embodiments, the reflection layer 41 is formed to have a gold mirror layer or a silver mirror layer. It should be noted that, current spreading may occur between the contact layer 51 and the second type semiconductor layer 61, and does not occur between the contact layer 51 and the reflection layer 41.

Referring to FIGS. 3 and 4, the bonding layer 31 is disposed on the reflection layer 41 opposite to the insulation layer 52 and the contact layer 51, and may be formed into a single layer or a laminated structure. For instance, the bonding layer 31 may include a laminated structure sequentially having a titanium layer, a nickel layer, and a tin layer.

The substrate 21 may be a silicon substrate, or a metal substrate that is made of copper, tungsten, molybdenum, or alloys thereof.

Referring to FIG. 3, the electrode 82 is disposed on the first type semiconductor layer 81 opposite to the active layer 71. The electrode 82 has a projection on an imaginary plane along a projection direction perpendicular to the surface of the current spreading layer 601, and is located within a projection of the insulation layer 52 on the imaginary plane. It should be noted that, referring to FIGS. 3 and 4, when the current spreading layer 601 has a plurality of the recesses, one of which is located corresponding to the electrode 82. The electrode 82 may be made of one of gold, germanium, nickel or any combinations thereof.

Figure 5:
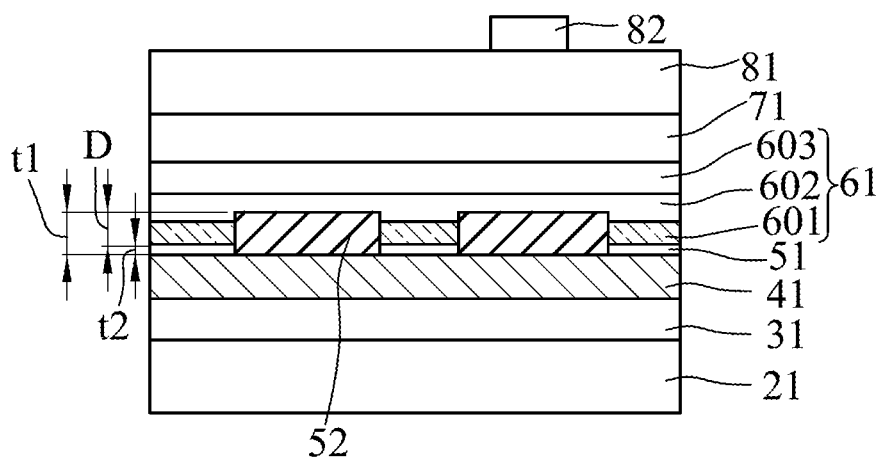
Figure 6:
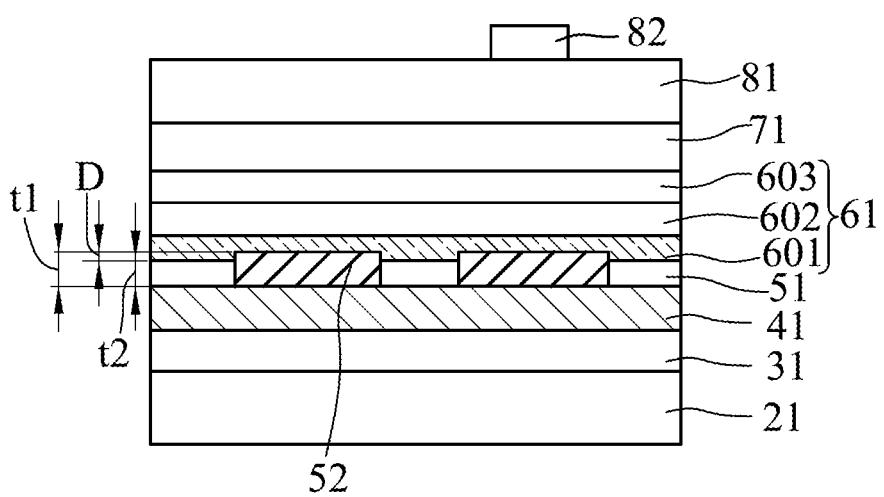
Figure 7:
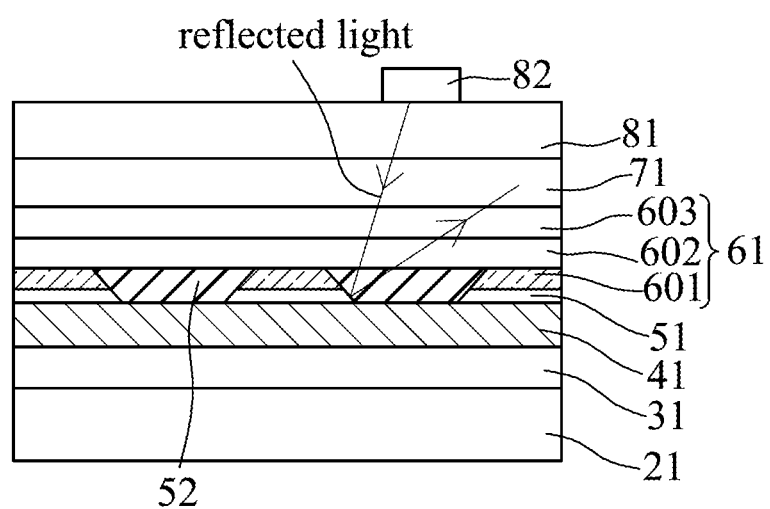

FIGS. 5 to 7 illustrate some variations of the embodiment of the light-emitting devices according to the present disclosure, each of which has a structure similar to that of the embodiment shown in FIG. 3, and the differences therebetween are described as follows.

Referring to FIG. 5, the insulation layer 52 extends into the transition layer 602 of the second type semiconductor layer 61. In certain embodiments, the insulation layer 52 further extends into the blocking layer 603 (not shown in the figures).

Referring to FIG. 6, the insulation layer 52 only extends into a portion of the thickness of the current spreading layer 601.

Referring to FIG. 7, a cross section of the insulation layer 52 along a plane parallel to a depth direction of the at least one recess forms a trapezoid having two oblique sides that are spaced apart in a direction perpendicular to the depth direction and that diverge from the contact layer 51 to the current spreading layer 601.

FIGS. 8 to 14 illustrate consecutive steps S1 to S8 of an embodiment of a method for producing the light-emitting device of the present disclosure.

Figure 8:
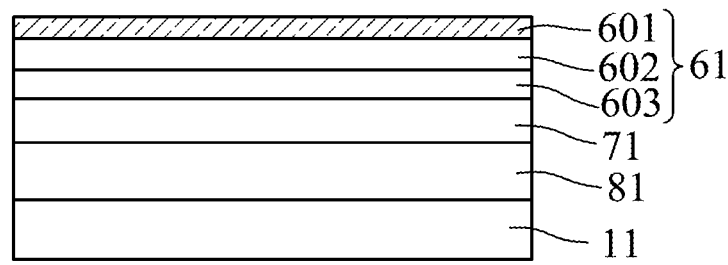
FIGS. 8 to 14 are schematic sectional views respectively illustrating consecutive steps in an embodiment of a method for producing the light-emitting device according to the present disclosure.

In step S1, referring to FIG. 8, an epitaxial growth substrate 11 is provided. The epitaxial growth substrate 11 may be one of a sapphire substrate, a silicon substrate, a silicon carbide substrate, etc., but is not limited to thus. Then, the first type semiconductor layer 81, the active layer 71, and the second type semiconductor layer 61 are disposed on one another and on the epitaxial growth substrate 11 in such order, each of which may be made of the abovementioned group III-V compound semiconductors including, but not limited to, GaN-based, Gap-based and AlGaInP-based materials. Thus, the light-emitting laminated structure is formed on the epitaxial growth substrate 11. In this embodiment, the second type semiconductor layer 61 is formed to have the blocking layer 603, the transition layer 602, and the current spreading layer 601 disposed on one another and on the active layer 71 in such order.

Figure 9:
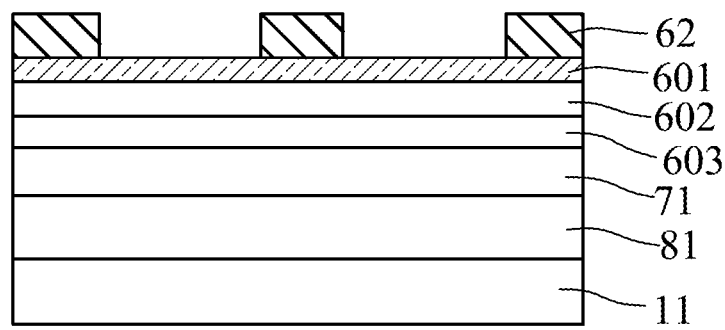

In step S2, referring to FIG. 9, a first photoresist layer 62 is formed on the surface of the current spreading layer 601 of the second type semiconductor layer 61 distal from the active layer 71. Then, the first photoresist layer 62 is patterned.

Figure 10:
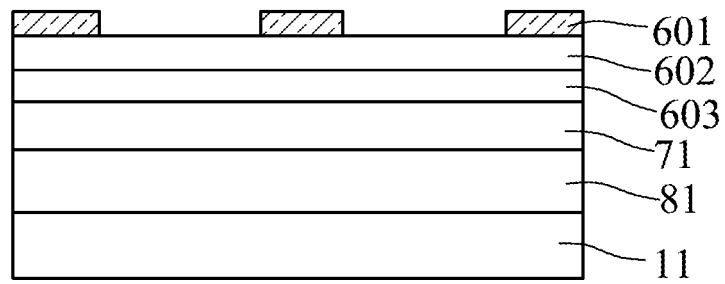

In step S3, referring to FIG. 10, with the patterned first photoresist layer 62 as a mask, the current spreading layer 601 is patterned using etching to form the at least one recess in the current spreading layer 601 (there are two recesses shown in FIG. 10). Then, the first photoresist layer 62 is removed.

Figure 11:
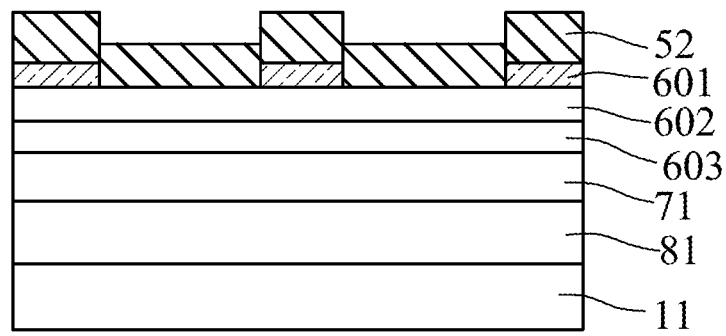
Figure 12:
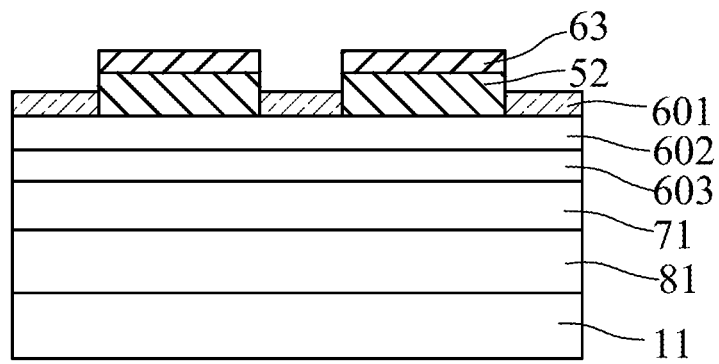

In step S4, referring to FIGS. 11 and 12, the insulation film that may be made of the material (e.g. SiO$_2$, Si$_3$N$_4$, SiON or any combinations thereof) is formed on the patterned current spreading layer 601 and fills the at least one recess of the current spreading layer 601. Then, a patterned second photoresist layer 63 is formed on the insulation film. The patterned second photoresist layer 63 exposes a portion of the insulation film that is formed on the current spreading layer 601 excluding the at least one recess. The insulation film is etched using the patterned second photoresist layer 63 as a mask to remove the exposed portion of the insulation film to form the insulation layer 52 filling the at least one recess. The insulation layer 52 protrudes from a surface of the current spreading layer 601 that faces in a direction away from the active layer 71.

Figure 13:
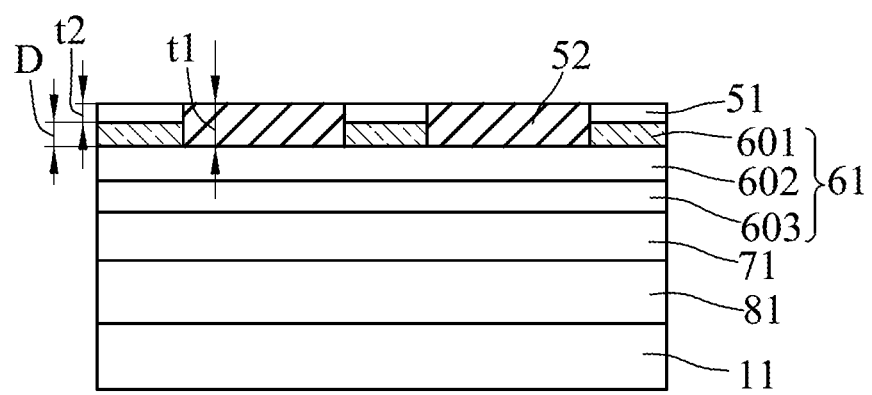

In step S5, referring to FIG. 13, the contact layer 51 that may be made of the metal material (e.g. Au, Zn, Be, Ti, Pt, or any combinations thereof or the transparent conductive material (e.g. ITO, IZO, and AZO, etc.) is formed on the surface of the current spreading layer 601 that lacks the insulation layer 52. The sum of the depth (D) of the at least one recess of the current spreading layer 601 and the thickness (t2) of the contact layer 51 is not less than a thickness (t1) of the insulation layer 52.

As mentioned above, when the sum of the depth (D) of the at least one recess and the thickness (t2) of the contact layer 51 is greater than the thickness (t1) of the insulation layer 52 (i.e., D+t2>t1), the surfaces of the insulation layer 52 and the contact layer 51 may be flattened by chemical mechanical polishing (CMP). In such case, the light-emitting device will be formed as shown in FIG. 3.

Furthermore, in this embodiment, the insulation layer 52 may penetrate the entire thickness of the current spreading layer 601 of the second type semiconductor layer 61. In some embodiments, the insulation layer 52 extends into the transition layer 602, or extends further into the blocking layer 603.

For instance, when the sum of the depth (D) and the thickness (t2) is greater than the thickness (t1) (i.e., D+t2>t1), the surface of the contact layer 51 exceeds the surface of the insulation layer 52 along the depth direction, thus the light-emitting device will be formed as shown in FIG. 4; and when the insulation layer 52 extends into the transition layer 602, the light-emitting device will be formed as shown in FIG. 5.

It certain embodiments, the insulation layer 52 may partially extend into the entire thickness of the current spreading layer 601 of the second type semiconductor layer 61. In such case, the light-emitting device will be formed as shown in FIG. 6.

Figure 14:
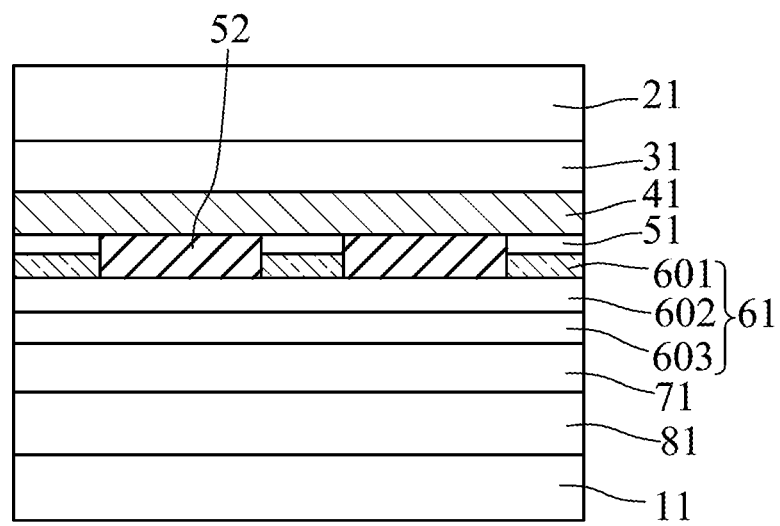

In step S6, referring to FIG. 14, the reflection layer 41 that may made of a material (e.g. Au, Ag, Al, Ru, Pt, Ti, Pd, or any combinations thereof) is formed on the insulation layer 52 and the contact layer 51.

In step S7, referring to FIG. 14, the substrate 21 is bonded to the reflection layer 41 through the bonding layer 31.

In step S8, the epitaxial growth substrate 11 is removed. The electrode 82 that may be made of Au, Ge, Ni, or any combinations thereof is formed on the first type semiconductor layer 81. Moreover, the projection of the electrode 82 on the imaginary plane along the projection direction perpendicular to the surface of the current spreading layer 601 is located within the projection of the insulation layer 52 on the imaginary plane.

In addition, in certain embodiments, in the step S3, the at least one recesses may be formed to have the trapezoid-shaped cross section along the plane parallel to the depth direction of the at least one recess. The trapezoid has two opposite oblique sides that are spaced apart in the direction perpendicular to the depth direction and that diverge from the contact layer 51 to the current spreading layer 601. In such case, the light-emitting device is formed as shown in FIG. 7.

Figure 15:
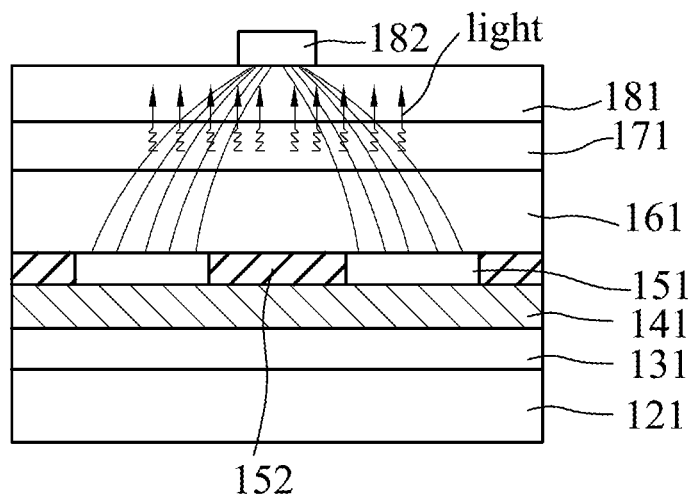
FIG. 15 illustrates a comparison of effects of the conventional light-emitting diode shown in FIG. 1 and the embodiment of the light-emitting device according to the present disclosure in confining flow of current to an effective light-emitting area, where (A) and (B) illustrate current flow and light-exiting of the conventional light-emitting diode and the light-emitting device of the present disclosure, respectively.
Figure 15:
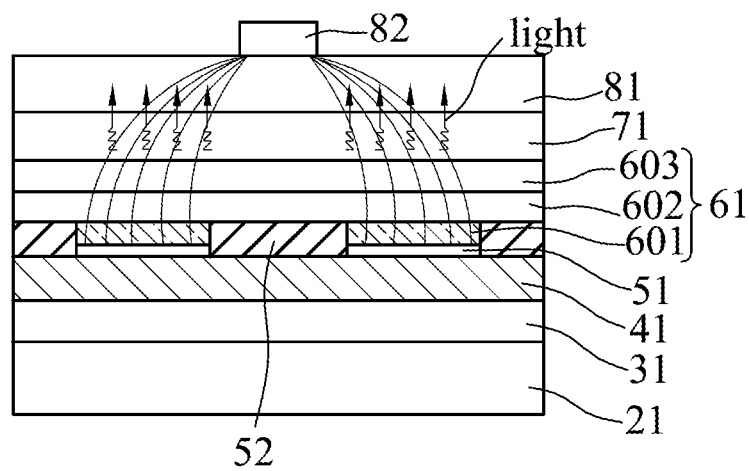

FIG. 15 illustrates a comparison of the conventional light-emitting diode and the light-emitting device of the present disclosure in confining flow of current to an effective light-emitting area, where (A) and (B) illustrate current flow and light-exiting of the conventional light-emitting diode as shown in FIG. 1 and the light-emitting device of the embodiment as shown in FIG. 3, respectively.

Conventionally, in the manufacture of the LED, the electrode is disposed on a light-exiting side of the LED, so that a part of the light emitted by the active layer that is located under the electrode would be blocked by the electrode, thereby causing some unavoidable light loss. Therefore, in the general light-emitting diode, the LED will be designed to have the current flow through an effective light-emitting region of the active layer where the least light will be blocked by the electrode, thereby improving the light-emitting efficiency of the LED. Moreover, the electrode is designed to have a projection on an imaginary plane along the projection direction perpendicular to the surface of the current spreading layer within that of the insulation layer, so that the current may avoidable flowing to the portion of the active layer that is located under the electrode.

Referring to the FIG. 15, in the conventional LED (as shown in (A)), since the insulation layer 152 is relatively far away from the electrode 182, its blocking effect on the current is relatively weak. Therefore, a part of the current may flow through the portion of the active layer 171 that is located under the electrode 182, and some of the light emitted would be blocked by the electrode 182.

In the light-emitting device of the embodiment of the present disclosure (as shown in (B)), the insulation layer 52 is disposed in the at least one recess of the current spreading layer 601 of the second type semiconductor layer 61. Since the insulation layer 52 is closer to the electrode 82, its blocking effect on the current is relatively effective. Therefore, the current would avoided flowing through the portion of the active layer 71 that is located under the electrode 82, thereby achieving maximum utilization of the current and reducing ineffective light emission. That is to say, if the at least one recess of the current spreading layer 601 has a greater depth (D), the insulation layer 52 may be made closer to the electrode 82, so that the light-emitting device of the present disclosure would have a superior light-exiting efficiency to obtain a higher brightness.

The light-emitting device and the production method of the present disclosure further have the following advantages:

1. By virtue of formation of the at least one recess of the current spreading layer 601 and the insulation layer 52 that fills the recess, a part of the current spreading layer 601 is removed, so that undesired light absorption of the second type semiconductor layer 61 would be reduced.
2. When the light-emitting device is driven, the current would flow to the entire surface of the second type semiconductor layer 61 through the contact layer 51 (i.e., the current passages), so that current crowding may be avoided. Thus, a sufficient current spreading effect may be obtained, so as to improve the light efficiency of the light-emitting device.
3. Since the insulation layer 52 is partially disposed in the recess of the current spreading layer 601, in the step S5 of the method for producing the light-emitting device, the required amount of the metal material or the transparent conductive material for making the contact layer 51 can be reduced, thereby reducing the manufacturing cost of the light-emitting device of the disclosure.
4. By virtue of the sum of the depth (D) of the at least one recess and the thickness (t2) of the contact layer 51 being not less than the thickness (t1) of the insulation layer 52, and the difference therebetween being less than 350 Å, unevenness of the interface between the reflection layer 41 and the bonding layer 31 may be reduced, so that the light-emitting device may have superior reliability.
5. Referring back to FIG. 7, when the insulation layer 52 is formed into a trapezoid shape (such as a reverse trapezoid shape), the contact layer 51 may be formed as a regular trapezoid that corresponds to the insulation layer 52. By virtue of such configuration, the light (shown in the FIG. 7) that is reflected by the electrode pad 82 can be further reflected upwardly by the inclined side wall of the contact layer 51. Thus, the light-emitting device may have a superior light-exiting efficiency.

6. Compared to a conventional method for producing the conventional light-emitting diode, the method for producing the light-emitting device of the present disclosure further includes the step S2. Thus, the current spreading layer 601 is patterned to have the recess, so as to obtain the light-emitting device as shown in FIGS. 3 to 7. Therefore, the light-emitting device produced by the method of the present disclosure may have the aforesaid advantages.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising:
   a first type semiconductor layer;
   an active layer;
   a second type semiconductor layer disposed adjacent to said active layer and opposite said first type semiconductor layer, and including a current spreading layer that has a recess;
   an insulation layer filling said recess and protruding from a surface of said current spreading layer that faces in a direction away from said active layer; and
   a contact layer disposed on said surface of said current spreading layer which lacks said insulation layer,
   a sum of a depth of said recess and a thickness of said contact layer being not less than a thickness of said insulation layer.

2. The light-emitting device as claimed in claim 1, wherein a difference between the sum of the depth of said recess and the thickness of said contact layer and the thickness of said contact layer ranges from 0 to 350 Å.

3. The light-emitting device as claimed in claim 1, wherein said insulation layer penetrates an entire thickness of said current spreading layer.

4. The light-emitting device as claimed in claim 1, wherein said insulation layer penetrates a portion of an entire thickness of said current spreading layer.

5. The light-emitting device as claimed in claim 1, wherein said second type semiconductor layer further includes a blocking layer that is close to said active layer, and a transition layer interposed between said blocking layer and said current spreading layer, said insulation layer extends into said transition layer.

6. The light-emitting device as claimed in claim 5, wherein said insulation layer extends into said blocking layer.

7. The light-emitting device as claimed in claim 1, wherein a cross section of said insulation layer along a plane parallel to a depth direction of said recess forms a trapezoid having two oblique sides that are spaced apart in a direction perpendicular to the depth direction and that diverge from said contact layer to said current spreading layer.

8. The light-emitting device as claimed in claim 1, further comprising an electrode disposed on said first type semiconductor layer, said electrode has a projection on an imaginary plane along a projection direction perpendicular to said surface of said current spreading layer, and that is located within a projection of said insulation layer on the imaginary plane.

9. The light-emitting device as claimed in claim 1, wherein the thickness of said insulation layer ranges from 1000 Å to 7000 Å.

10. The light-emitting device as claimed in claim 1, wherein the thickness of said contact layer ranges from 500 Å to 3000 Å.

11. The light-emitting device as claimed in claim 1, wherein said current spreading layer has a thickness ranging from 0.15 μm to 2 μm.

12. The light-emitting device as claimed in claim 1, wherein a cross section of said contact layer along a plane perpendicular to a depth direction of said recess has a circular outline that has a diameter ranging from 4 μm to 12 μm.

13. The light-emitting device as claimed in claim 1, wherein, of an area of said second type semiconductor layer 61, a percentage of an area of said contact layer 51 ranges from 1.5% to 10%.

14. A method for producing a light-emitting device, comprising the steps of:
   providing a light-emitting laminated structure having a first type semiconductor layer, an active layer, a second type semiconductor layer that are disposed on one another in such order, said second type semiconductor layer including a current spreading layer;
   patterning said current spreading layer to form a recess;
   forming an insulation layer that fills said recess of said current spreading layer; and
   forming a contact layer on a surface of said current spreading layer that lacks said insulation layer, a sum of a depth of said recess and a thickness of said contact layer being not less than a thickness of said insulation layer.

15. The method as claimed in claim 14, wherein said insulation layer penetrates an entire thickness of said current spreading layer of said second type semiconductor layer.

16. The method as claimed in claim 14, wherein said insulation layer penetrates a portion of an entire thickness of said current spreading layer of said second type semiconductor layer.

17. The method as claimed in claim 14, wherein said second type semiconductor layer further includes a blocking layer and a transition layer interposed between said active layer and said current spreading layer, said insulation layer extends into said transition layer.

18. The method as claimed in claim 17, wherein said insulation layer extends further into said blocking layer.

19. The method as claimed in claim 14, wherein a cross section of said recess along a plane parallel to a depth direction of said recess forms a trapezoid having two opposite oblique sides that are spaced apart in a direction perpendicular to the depth direction and that diverge from said contact layer to said current spreading layer.

20. The method as claimed in claim 14, further comprising flattening surfaces of said insulation layer and said contact layer when the sum of the depth of said recess and the thickness of said contact layer is greater than the thickness of said insulation layer.

* * * * *